US012348243B2

(12) United States Patent
Bastien et al.

(10) Patent No.: US 12,348,243 B2
(45) Date of Patent: Jul. 1, 2025

(54) METHOD AND APPARATUS FOR TRANSMITTING DATA CONCURRENTLY WITH A PULSE-ENCODED SIGNAL

(71) Applicant: Allegro MicroSystems, LLC, Manchester, NH (US)

(72) Inventors: Solène Bastien, Naves-Parmelan (FR); Andreas P. Friedrich, Metz-Tessy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 101 days.

(21) Appl. No.: 18/355,623

(22) Filed: Jul. 20, 2023

(65) Prior Publication Data

US 2023/0378977 A1     Nov. 23, 2023

Related U.S. Application Data

(63) Continuation-in-part of application No. 17/663,930, filed on May 18, 2022.

(51) Int. Cl.
*H03M 13/09*     (2006.01)
*H04L 67/12*     (2022.01)

(52) U.S. Cl.
CPC .......... *H03M 13/098* (2013.01); *H04L 67/12* (2013.01)

(58) Field of Classification Search
None
See application file for complete search history.

(56) References Cited

U.S. PATENT DOCUMENTS

| 6,542,847 B1 | 4/2003 | Lohberg et al. |
| 6,687,644 B1 | 2/2004 | Zinke et al. |

(Continued)

FOREIGN PATENT DOCUMENTS

| DE | 10 2017 125562 | 5/2018 |
| DE | 10-2017-125562 A1 | 5/2018 |

(Continued)

OTHER PUBLICATIONS

U.S. Non-Final Office Action dated Dec. 10, 2024 for U.S. Appl. No. 17/663,930; 11 Pages.

(Continued)

*Primary Examiner* — Mark D Featherstone
*Assistant Examiner* — Jack Kensington Barnett
(74) *Attorney, Agent, or Firm* — Daly, Crowley, Mofford & Durkee, LLP

(57) ABSTRACT

A method is provided for transmitting a message concurrently with a pulse-encoded signal, the method comprising: assigning an identifier to the message; transmitting an identifier of the message between every two consecutive pulses of the pulse-encoded signal until the whole message is transmitted; transmitting a first portion of a payload of the message between every two consecutive pulses of the pulse-encoded signal until the whole message is transmitted; and transmitting a different part of a second portion of the payload of the message between every two consecutive pulses of the pulse-encoded signal until the whole message is transmitted, wherein the pulse-encoded signal encodes information by varying a frequency of pulses of the pulse-encoded signal, and the message is transmitted over a plurality of transmission periods that are delimited by respective consecutive pulses of the pulse-encoded signal.

17 Claims, 11 Drawing Sheets

(56) References Cited

U.S. PATENT DOCUMENTS

| | | | |
|---|---|---|---|
| 7,091,876 B2 | 8/2006 | Steger | |
| 9,664,748 B2 | 5/2017 | Friedrich et al. | |
| 10,216,559 B2 | 2/2019 | Fernandez | |
| 10,436,606 B2 | 10/2019 | Kerdraon et al. | |
| 10,480,957 B2 | 11/2019 | Kerdraon et al. | |
| 10,481,218 B2 | 11/2019 | Prentice et al. | |
| 10,495,700 B2 | 12/2019 | Prentice et al. | |
| 10,598,514 B2 | 3/2020 | Pepka et al. | |
| 10,656,170 B2 | 5/2020 | Lim et al. | |
| 11,125,590 B2 | 9/2021 | Geiger et al. | |
| 2007/0088869 A1* | 4/2007 | Kadota | G06F 3/1229 710/36 |
| 2011/0250862 A1* | 10/2011 | Schliwa-Bertling | H04W 68/02 455/404.1 |
| 2012/0177096 A1* | 7/2012 | Yano | H04L 1/0071 375/224 |
| 2013/0046488 A1 | 2/2013 | Donovan et al. | |
| 2014/0210641 A1* | 7/2014 | Hammerschmidt | G08C 19/16 340/870.3 |
| 2016/0123771 A1 | 5/2016 | David et al. | |
| 2017/0307407 A1 | 10/2017 | Judkins, III et al. | |
| 2017/0315146 A1 | 11/2017 | Koeck et al. | |
| 2018/0067174 A1* | 3/2018 | Prentice | H03K 7/08 |
| 2020/0049729 A1 | 2/2020 | Jeon et al. | |
| 2021/0262831 A1 | 8/2021 | Foletto et al. | |
| 2023/0400477 A1 | 12/2023 | Friedrich et al. | |

FOREIGN PATENT DOCUMENTS

| | | | |
|---|---|---|---|
| DE | 10 2019 133440 | | 6/2021 |
| DE | 10-2019-133440 A1 | | 6/2021 |
| EP | 1490772 | | 12/2004 |

OTHER PUBLICATIONS

Extended European Search Report dated Jan. 8, 2024 for European Application No. 23174177.8; 13 Pages.
U.S. Restriction Requirement dated Aug. 15, 2024 for U.S. Appl. No. 17/663,930; 10 Pages.
Response to Extended European Search Report (EESR) dated Jan. 8, 2024 for European Application No. 23174177.8; Response filed Aug. 7, 2024; 66 Pages.
European Intention to Grant dated Mar. 11, 2025 for European Application No. EP23174177.8; 7 Pages.
Allegro MicroSystems, LLC datasheet A19350 "High-Accuracy GMR Wheel Speed and Direction Sensor IC"; Nov. 16, 2018; 14 Pages.
Infineon Technologies; "High-End GMR Wheel Speed Sensor with direction detection, ASIL B(D);" TLE5046iC Product Description; Jun. 2020; 14 pages.
Pancik, et al. "Open source based peripherals for automotive electronic control unit"; EAI Endorsed Transactions on Scalable Information Systems; Jun. 19, 2018; 7 Pages.
Partial European Search Report dated Sep. 27, 2023 for European Application No. EP23174177.8; 15 Pages.
U.S. Appl. No. 18/435,241, filed Feb. 7, 2024, Rivas et al.
Response to U.S. Non-Final Office Action dated Dec. 10, 2024 for U.S. Appl. No. 17/663,930; Response Filed Feb. 14, 2025; 9 Pages.
Allegro MicroSystems, LLC, "High-Resolution GMR Wheel Speed and Distance Sensor IC;" Data Sheet A19360, Rev. 2; Dec. 6, 2022; 18 Pages.
U.S. Notice of Allowance dated Apr. 15, 2025 for U.S. Appl. No. 17/663,930; 10 Pages.
Amendment Under Rule 312 filed on Apr. 24, 2025 for U.S. Appl. No. 17/663,930; 4 Pages.

* cited by examiner

400

| PULSE-ENCODING FREQUENCY | SPEED | AVAILABLE DATA BITS |
|---|---|---|
| <1800 Hz | 135 km/h | Bit 0 to bit 8 |
| <2000 Hz | 150 km/h | Bit 0 to bit 7 |
| <2200 Hz | 165 km/h | Bit 0 to bit 6 |
| <2400 Hz | 180 km/h | Bit 0 to bit 5 |
| <2800 Hz | 210 km/h | Bit 0 to bit 4 |
| <3200 Hz | 240 km/h | Bit 0 to bit 3 |
| <4000 Hz | 300 km/h | Bit 0 to bit 2 |
| <5000 Hz | 375 km/h | Bit 0 to bit 1 |

METHOD AND APPARATUS FOR TRANSMITTING DATA CONCURRENTLY WITH A PULSE-ENCODED SIGNAL

CLAIM OF PRIORITY

The present application is filed as a Continuation-in-Part application of U.S. application Ser. No. 17/663,930, filed on May 18, 2022, and entitled: High Resolution Sensing Protocol, which is herein incorporated by reference in its entirety.

BACKGROUND

Magnetic field sensors can be used in various types of devices to measure and monitor properties of systems in a wide variety of different applications. For example, sensors have become common in products that rely on electronics in their operation, such as motor control systems and automobile control systems. In automotive applications, a Hall-based or magneto-resistive sensor is used in combination with a ring magnet to monitor and measure the wheel speed, detect direction of rotation, and provide other information to the car's electronic control unit (ECU). The ECU, in turn, may use these data for passive monitoring and display or for active control as part of an anti-lock braking system (ABS), parking assist (e.g. automatic parallel parking), and other such systems.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a method is provided for transmitting a message concurrently with a pulse-encoded signal, the method comprising: assigning an identifier to the message; transmitting an identifier of the message between every two consecutive pulses of the pulse-encoded signal until the whole message is transmitted; transmitting a first portion of a payload of the message between every two consecutive pulses of the pulse-encoded signal until the whole message is transmitted; and transmitting a different part of a second portion of the payload of the message between every two consecutive pulses of the pulse-encoded signal until the whole message is transmitted, wherein the pulse-encoded signal encodes information by varying a frequency of pulses of the pulse-encoded signal, and the message is transmitted over a plurality of transmission periods that are delimited by respective consecutive pulses of the pulse-encoded signal.

According to aspects of the disclosure, a method is provided for reconstituting a message that is transmitted concurrently with a pulse-encoded signal over a plurality of transmission periods, each of the transmission periods being delimited by a different pair of consecutive pulses of the pulse-encoded signal, the method comprising: storing, in a buffer, an instance of a first portion of a payload of the message that is received in one of the plurality of transmission periods and discarding any instances of the first portion that are received during other ones of the plurality of transmission periods; and storing, in the buffer, each of a plurality of parts of a second portion of the payload of the message, each of the plurality of parts of the second portion of the message being received during a different respective one of the plurality of transmission periods, wherein the pulse-encoded signal encodes information by varying a frequency of pulses of the pulse-encoded signal.

According to aspects of the disclosure, a system is provided, comprising: a memory; and a processing circuitry that is operatively coupled to the memory, the processing circuitry being configured to: assign an identifier to a message; transmit an identifier of the message between every two consecutive pulses of a pulse-encoded signal until the whole message is transmitted; transmit a first portion of a payload of the message between every two consecutive pulses of the pulse-encoded signal until the whole message is transmitted; and transmit a different part of a second portion of the payload of the message between every two consecutive pulses of the pulse-encoded signal until the whole message is transmitted, wherein the pulse-encoded signal encodes information by varying a frequency of pulses of the pulse-encoded signal, and the message is transmitted over a plurality of transmission periods that are delimited by respective consecutive pulses of the pulse-encoded signal.

According to aspects of the disclosure, a system is provided, comprising: a memory; and a processing circuitry that is operatively coupled to the memory, the processing circuitry being configured to: store, in a buffer, an instance of a first portion of a payload of a message that is received in one of a plurality of transmission periods and discarding any instances of the first portion that are received during other ones of the plurality of transmission periods; and store, in the buffer, each of a plurality of parts of a second portion of the payload of the message, each of the plurality of parts of the second portion of the message being received during a different respective one of the plurality of transmission periods, wherein each of the plurality of transmission periods is delimited by a different pair of consecutive pulses of a pulse-encoded signal.

According to aspects of the disclosure, a non-transitory computer-readable medium storing one or more processor-executable instructions, which, when executed by at least one processor, cause the at least one processor to execute a process for transmitting a message concurrently with a pulse-encoded signal, the process including the operations of: assigning an identifier to the message; transmitting an identifier of the message between every two consecutive pulses of the pulse-encoded signal until the whole message is transmitted; transmitting a first portion of a payload of the message between every two consecutive pulses of the pulse-encoded signal until the whole message is transmitted; and transmitting a different part of a second portion of the payload of the message between every two consecutive pulses of the pulse-encoded signal until the whole message is transmitted, wherein the pulse-encoded signal encodes information by varying a frequency of pulses of the pulse-encoded signal, and the message is transmitted over a plurality of transmission periods that are delimited by respective consecutive pulses of the pulse-encoded signal.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent FIG. 1 is a diagram of an example of a vehicle, according to aspects of the disclosure;

DETAILED DESCRIPTION

Figure 1:
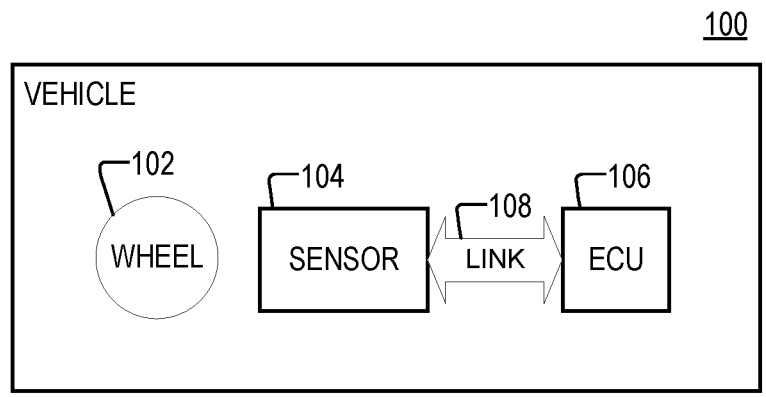

FIG. 1 is a schematic diagram of a vehicle 100. As illustrated, the vehicle 100 may include a wheel 102 and a sensor 104 that is coupled to an electronic control unit (ECU) 106 via a link 108. In operation, sensor 104 may measure the speed of rotation of the wheel 102 and transmit indications of the wheel speed to the ECU 106 over link 108. According to the present example, the indications of the wheel speed are transmitted using a pulse-encoded signal. The pulse-encoded signal is transmitted concurrently with data over the same physical medium (e.g., a pair of wires). The data is transmitted serially between the pulses of the pulse-encoded signal. One challenge associated with transmitting data between individual pulses that encode speed is that the frequency of the pulses varies, which causes messages to be truncated if there is not enough time (or clock cycles) to transmit a message between consecutive pulses.

The discussion that follows presents a method for transmitting data concurrently with a pulse-encoded signal. The method is advantageous because it does not require the message to be truncated if there is not enough time to transmit the entire message in the same transmission period. In one aspect, the method may be used to improve the AK-protocol. The AK-protocol is described in the white paper titled "Requirement Specifications for Standardized Interface for Wheel Speed Sensors with Additional Information 'AK-Protokoll'." The AK-protocol uses a two-wire connection and a serial data protocol for the transmission of information. When the AK-protocol is used, speed measurements may be pulse-encoded, and additional data may be transmitted between the pulses that encode the speed. Although the AK-protocol is one example of a protocol that involves the combined transmission of a pulse-encoded signal and data, it will be understood that the technique an example of which is described in the present disclosure is not limited to being used in conjunction with the AK-protocol only. Stated succinctly, the technique that is the subject of the present disclosure can be used in any context, and in conjunction with any protocol, that involves the transmission of a pulse-encoded signal, irrespective of the type of data that is encoded by the pulse-encoded signal.

Figure 2:
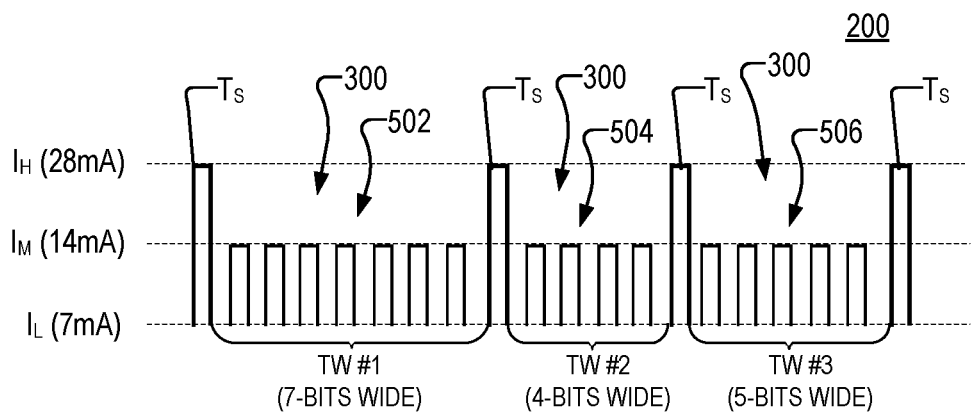
FIG. 2 is a diagram of a waveform, according to aspects of the disclosure.

FIG. 2 is a diagram of a waveform 200 that is transmitted by sensor 104 to ECU 106 via link 108. The waveform 200 indicates that data is output by varying the electrical current output of sensor 104. Although, in the present example, data is output by varying the electrical current output of sensor 104, alternative implementations are possible in which the data is output by varying the voltage output of sensor 104. Stated succinctly, the present disclosure is not limited to using any specific technique for transmitting the data.

The waveform includes pulses Ts, which encode the speed measurements taken by sensor 104. The collection of pulses Ts is herein referred to as "a pulse-encoded signal." Although, in the present example, the pulse-encoded signal is used to encode speed, it will be understood that the present disclosure is not limited to any specific parameter being encoded by the pulse-encoded signal. According to the present example, each of the pulses Ts may have a value of approximately 28 mA.

The time period between any two consecutive pulses Ts is herein referred to as a transmission window (TW). In each transmission window, one or more data bits may be transmitted. The data bits may be part of a data package DP. As illustrated, the frequency of the pulses Ts varies, and with it, the length of the transmission windows TW varies. According to the present example, transmission window TW #1 is 7 bits wide, transmission window TW #2 is 4 bits wide, and transmission window TW #3 is 5 bits wide.

According to the present disclosure, in each transmission window TW #1, a different portion of a message 300 is transmitted. The signal used to encode the bits of message 300 has a logic-low value of 7 mA or less and a logic-high value of about 14 mA. The number of bits of message 300 that can fit in each transmission window varies depending on the frequency of the pulses Ts. FIGS. 5-13, which are discussed further below, provide examples of different processes for transmitting message 300.

Figures 3, 4:
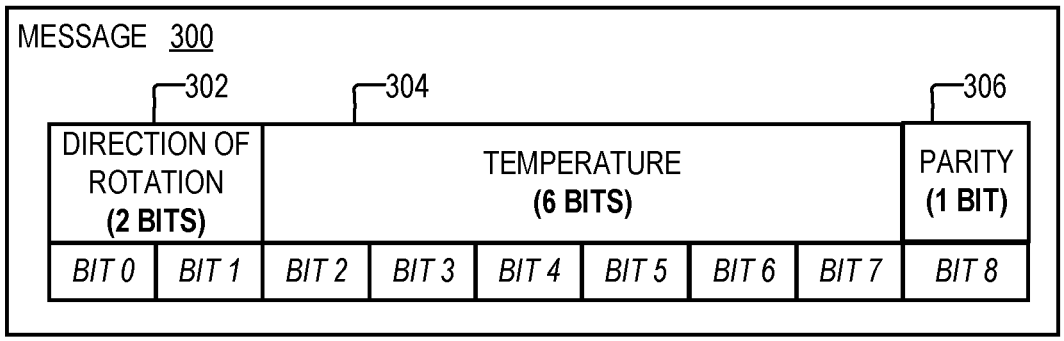
FIG. 3 is a diagram of an example of a message, according to aspects of the disclosure.
FIG. 4 is a diagram illustrating a method for pulse-encoding speed, according to aspects of the disclosure.

FIG. 3 is a diagram of message 300, according to one example. As illustrated, message 300 may include user data portions 302 and 304, and a parity portion 306. According to the present example, portion 302 indicates the direction of rotation of wheel 102, and portion 304 indicates a temperature value measured by sensor 104. However, the present disclosure is not limited to any specific type of information being contained in portions 302 and 304. For example, portion 304 may include airgap information, diagnostic information, and/or any other suitable type of information. In one implementation, portion 302 may include what is deemed critical information, while portion 304 includes less-critical information. According to the techniques described further below with respect to FIGS. 5-12, in a plurality of transmission windows over which message 300 is transmitted, portion 302 may be transmitted in each of the transmission windows concurrently with different parts of portion 304. Thus, over the course of the transmission of message 300, portion 302 may be repeatedly sent to ECU 106 while, at the same time, different parts of portion 304 or portion 306 trickle down to ECU 106 until the entire message 300 has reached ECU 106.

Portion 306, according to the present example, includes one or more parity bits calculated based on one or both of portions 302 and 304. Although, in the present example, portion 306 includes parity bits, the present disclosure is not limited to any specific type of protection information (PI) being contained in portion 306. Although portion 306 is 1-bit wide in the present example, the present disclosure is not limited to any specific width for portion 306.

According to the example of FIG. 2, packets 502, 504, and 506 are transmitted in each of transmission windows TW #1, TW #2, and TW #3, respectively. Each packet 502, 504, and 506 includes portion 302 of message 300. Each of packets 502, 504, and 506 includes a different part of portion 304 of message 300. The last one of packets 502, 504, and 506 (i.e., packet 506) may include portion 306 of message 300.

In general, in a set of packets used to transmit message 300, different parts of portion 304 may be transmitted in each of the packets until the entire portion 304 is transmitted. Afterward, the remaining one or more packets in the set may be used to carry portion 306 (e.g., see FIG. 5). A packet may carry both parts of portion 304, as well as parts of (or the entire) portion 306. When the duration of a transmission window is too short to carry parts of portions 304 and 306, the packet transmitted in this transmission window may carry only portion 302. Furthermore, in some implementations, each of the packets in the set may include parity data calculated over the contents of the packets instead of parity data for the entire message 300 being contained in the last one or more packets in the set (e.g., see FIG. 6).

FIG. 4 shows table 400, according to aspects of the disclosure. Table 400 is provided to illustrate the relationship between the speed of wheel 102, the frequency of the pulse-encoded signal that represents the speed of wheel 102 (generated by sensor 104), and the number of bits available for data transmission between any two consecutive pulses of the pulse-encoded signal. By way of example, the speed may be calculated by using 160 pole pairs with 2 pulses per cycle and a tire circumference of 2 m in this example. Table 400 illustrates that for speeds up to 135 km/h, the frequency of the pulse-encoded signal would be less than 1800 Hz, and between any two consecutive pulses of the pulse-encoded signal, there would be enough time to transmit 9 bits of data. For speeds between 135-150 km/h, the frequency of the pulse-encoded signal would be in the range of 1800-2000 Hz, and between any two consecutive pulses of the pulse-encoded signal, there would be enough time to transmit 8 bits of data. For speeds between 150-165 km/h, the frequency of the pulse-encoded signal would be in the range of 2000-2200 Hz, and between any two consecutive pulses of the pulse-encoded signal, there would be enough time to transmit 7 bits of data. For speeds between 165-180 km/h, the frequency of the pulse-encoded signal would be in the range of 2200-2400 Hz, and between any two consecutive pulses of the pulse-encoded signal, there would be enough time to transmit 6 bits of data. For speeds between 180-210 km/h, the frequency of the pulse-encoded signal would be in the range of 2400-2800 Hz, and between any two consecutive pulses of the pulse-encoded signal, there would be enough time to transmit 5 bits of data. For speeds between 210-240 km/h, the frequency of the pulse-encoded signal would be in the range of 2800-3200 Hz, and between any two consecutive pulses of the pulse-encoded signal, there would be enough time to transmit 4 bits of data. For speeds between 240-300 km/h, the frequency of the pulse-encoded signal would be in the range of 3200-4000 Hz, and between any two consecutive pulses of the pulse-encoded signal, there would be enough time to transmit 3 bits of data. And for speeds between 300-375 km/h, the frequency of the pulse-encoded signal would be in the range of 4000-5000 Hz, and between any two consecutive pulses of the pulse-encoded signal, there would be enough time to transmit 2 bits of data.

Figure 5:
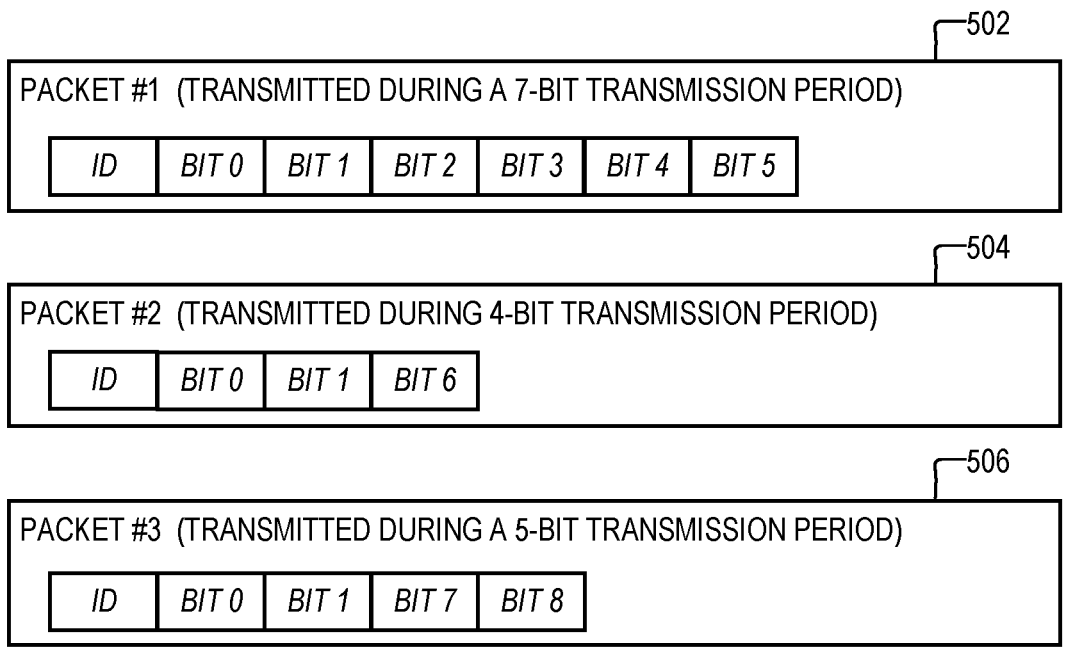
FIG. 5 is a diagram of an example of a set of packets, according to aspects of the disclosure.

FIG. 5 shows the format of packets 502, 504, and 506, according to one example. The formatting shown in FIG. 5 results when one of the processes 700A and 800 (shown in FIGS. 7A-8) is used to encode the packets. As illustrated, packet 502 may include an ID bit and bits 0-5 of message 300. As noted above, bits 0-1 encode portion 302 of message 300, and bits 2-5 encode part of portion 304. The ID bit may be associated with the message, and it may have the same value in each of packets 502, 504, and 506 to signify that packets 502, 504, and 506 contain parts of the same message. Packet 504 may include the ID bit, bits 0-1 of message 300, and bit 6 of message 300. As noted above, bits 0-1 encode portion 302 of message 300, and bit 6 is part of portion 304. Packet 506 may include the ID bit, bits 0-1 of message 300, and bits 7-8 of message 300. As noted above, bits 0-1 constitute portion 302 of message 300, bit 7 is part of portion 304, and bit 8 is part of portion 306.

Figure 6:
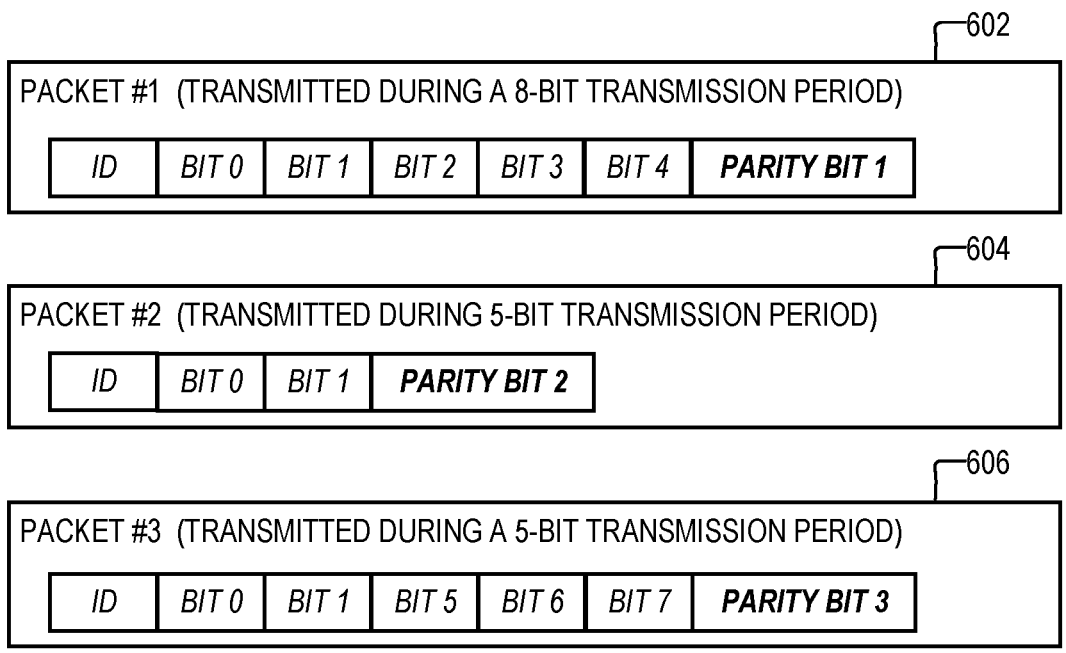
FIG. 6 is a diagram of an example of a set of packets, according to aspects of the disclosure.

FIG. 6 shows the format of packets 502, 504, and 506, according to another example. The formatting shown in FIG. 6 results when one of processes 700B and 900 (shown in FIGS. 7B and 9) is used to encode the packets. Packet 602 may include an ID bit, bits 0-4 of message 300, and a first parity bit (hereinafter referred to as parity bit 1). As noted above, bits 0-1 encode portion 302 of message 300, and bits 2-5 encode part of portion 304. Parity bit 1 may be calculated over bits 0-4 of message 300, and it may be used to determine if packet 602 has been corrupted. Packet 604 may include the ID bit, bits 0-1 of message 300, and a second parity bit (hereinafter referred to as parity bit 2). As noted above, bits 0-1 encode portion 302 of message 300. Parity bit 2 may be calculated over bits 0-1 of message 300, and it may be used to determine if packet 604 has been corrupted. Packet 606 may include the ID bit, bits 0-1 of message 300, bits 5-7 of message 300, and a third parity bit (hereinafter referred to as parity bit 3). As noted above, bits 0-1 constitute portion 302 of message 300, and bits 5-7 are part of portion 304. Parity bit 3 may be calculated over bits 0, 1, 5, 6, and 7 of message 300, and it may be used to determine if packet 606 has been corrupted.

Figure 7A:
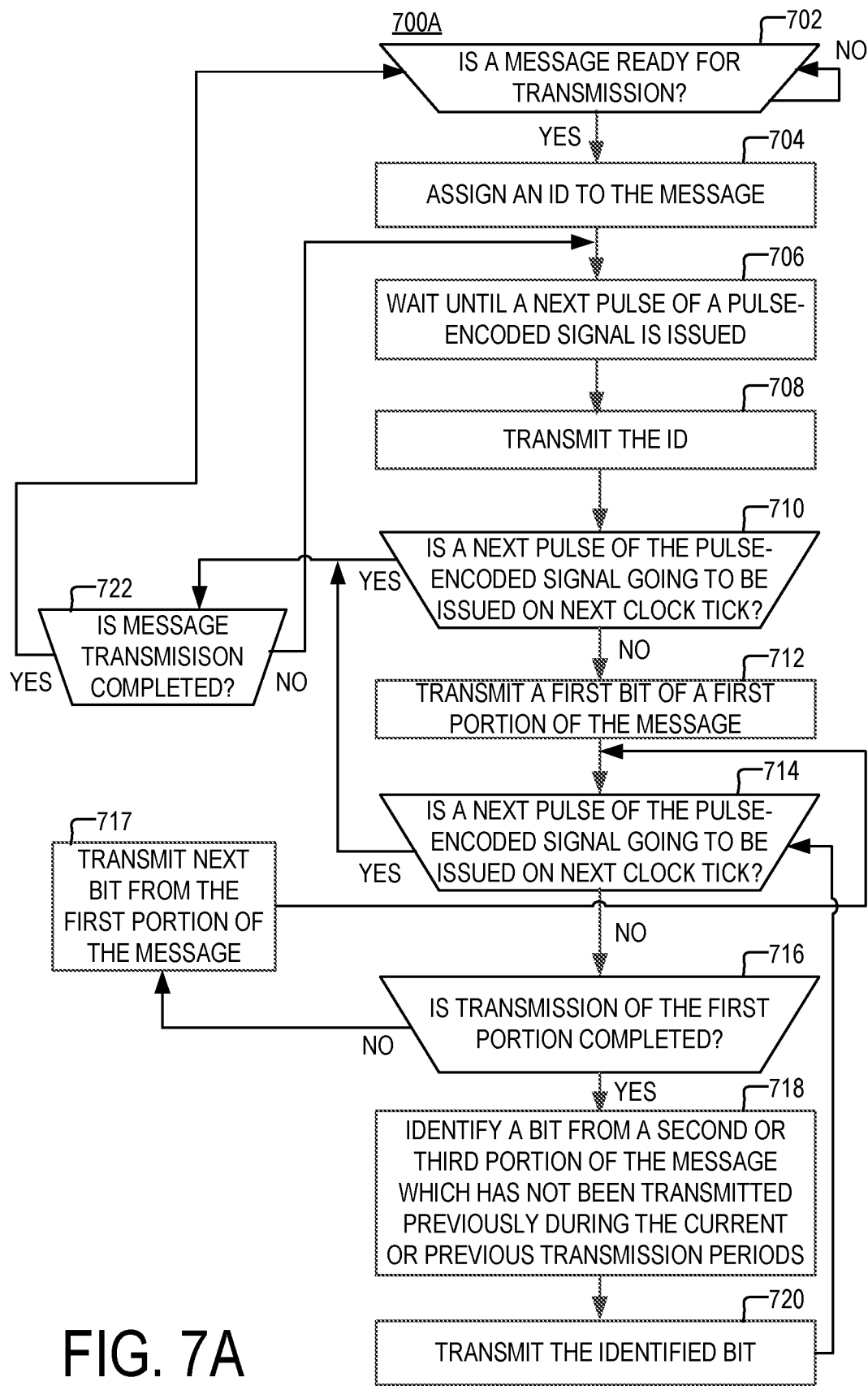
FIG. 7A is a flowchart of an example of a process, according to aspects of the disclosure.

FIG. 7A is a flowchart of an example process 700A, according to aspects of the disclosure. In this example, process 700A is performed by the sensor 104. However, the present disclosure is not limited to any specific entity performing process 700A. As discussed further below, the execution of process 700A results in the concurrent transmission of data and a pulse-encoded signal. The data and pulse-encoded signal can be transmitted from the sensor to a remote device over a data link. In some implementations, the remote device may be the same as or similar to the ECU 106, which is discussed above with respect to FIG. 1. The link in some implementations may be the same as or similar to the data link 108.

At step 702, sensor 104 detects when a message is ready for transmission. The message may be the same as or similar to message 300, which is discussed above with respect to FIG. 3. If a message is ready for transmission, the process proceeds to step 704. Otherwise, step 702 is repeated.

At step 704, sensor 104 assigns an ID to the message. In this example, the ID is a 1-bit number. To assign the ID, the sensor may first determine the ID of the previous message that was sent by sensor 104. If the ID of the previous message was '0', the sensor 104 may assign an ID of '1' to the message detected at step 702. If the ID of the previous message was '1', the sensor 104 may assign an ID of '0' to the message detected at step 702. Although in the examples provided throughout the disclosure, the ID is 1-bit wide, it will be understood that the present disclosure is not limited thereto. For example, in some implementations, the ID may be comprised of more than one data bits.

At step 706, sensor 104 waits until the next pulse of the pulse-encoded signal is issued. The pulse-encoded signal may be the same as or similar to the pulse-encoded signal discussed above with respect to FIG. 2. The next pulse may correspond to one of the pulses Ts. The next pulse may be transmitted on a data link, such as link 108, which is discussed above with respect to FIG. 1.

At step 708, the sensor transmits the ID to a remote device.

At step 710, the sensor 104 determines if the next pulse of the pulse-encoded signal will be issued on the next tick (or edge) of the clock that drives the transmission of data and the pulse-encoded signal over the data link. As indicated above in FIG. 4, the frequency of the clock that drives the transmission of pulses and/or data over the data link may be 15-20 kHz. On the other hand, the operating frequency of the processing circuitry of sensor 104 may be 15-20 MHz, which allows sensor 104 enough time to take action before the next pulse of the pulse-encoded signal is output on link 108. If the next pulse of the pulse-encoded signal will be issued on the next clock edge, process 700A proceeds to step 722. Otherwise, process 700A proceeds to step 712. The present example assumes that there will be enough time to transmit at least one bit between any two consecutive pulses. However, in applications in which this is not guaranteed, the check of step 710 may be performed prior to the transmission of the ID as well.

At step 712, sensor 104 transmits the first bit of the first portion of the message. In this example, the first portion may be the same as or similar to portion 302 of message 300, which is discussed above with respect to FIG. 3.

At step 714, sensor 104 determines if the next pulse of the pulse-encoded signal will be issued on the next tick (or edge) of the clock that drives the transmission of data and the pulse-encoded signal over the data link. If the next pulse of the pulse-encoded signal will be issued on the next clock edge, process 700A proceeds to step 722. Otherwise, process 700A proceeds to step 716.

At step 716, sensor 104 detects if the transmission of the first portion of the message is completed. If the transmission of the first portion of the message is completed, the process 700A proceeds to step 718. Otherwise, the process proceeds to step 717.

At step 717, sensor 104 transmits the next bit of the first portion of the message. The next bit of the first portion of the message is the bit immediately following the last bit of the first portion that was transmitted. After step 717 is completed, the process 700A returns to step 714.

At step 718, sensor 104 identifies a bit from the second portion or third portion of the message that has not been transmitted before during the execution of process 700A. The second portion of the message may be the same as or similar to portion 304 of message 300, which is discussed above with respect to FIG. 3. The third portion of the message may be the same as or similar to portion 306 of message 300, which is discussed above with respect to FIG. 3. In some implementations, during each iteration of step 718, sensor 104 may select respective bits from the second portion in consecutive order until all bits from the second portion have been selected. Only after all bits from the second portion have been selected, sensor 104 may begin to select bits from the third portion. Although in this example the third portion includes only one bit, alternative implementations are possible in which the third portion includes more than one bit.

At step 720, sensor 104 transmits the identified bit.

At step 722, sensor 104 detects whether the entire message (detected at step 702) has been transmitted. If the entire message has been transmitted, the process 700A returns to step 702. Otherwise, the process 700A returns to step 706.

As discussed above, process 700A involves the transmission of a message over a plurality of transmission windows. The first portion of the message is transmitted in each of the plurality of transmission windows, while a different part of the second portion may be transmitted in each of the transmitted windows. In other words, in each of the plurality of transmission windows, the first portion is transmitted in its entirety together with a different part of the second portion. In some respects, the first portion may be information that is considered more important, which necessitates the information to be communicated in each transmission window. The second portion, on the other hand, may include information that is considered less important, which permits the information to be transmitted over multiple transmission windows.

In some implementations, the first portion may include airgap information and the second portion may include temperature. The second portion may be calculated (or generated) once before the transmission of the message (detected at step 702) begins. In other words, the second portion may be calculated (or generated) prior to executing steps 702 or 704.

The first portion on the other hand may be calculated once or multiple times. In the example of FIG. 7A, the first portion is calculated (or generated) once, before the beginning of the message (detected at step 702) begins. In other words, the first portion may be calculated (or generated) prior to executing steps 702 or 704.

In another example, however, the first portion may be re-calculated (or regenerated multiple times). For instance, one instance of the first portion may be calculated (or generated) prior to executing steps 702 or 704 and transmitted starting at the first iteration of step 712. Afterwards, prior to each subsequent iteration of step 712, the information that is part of the first portion may be re-calculated or refreshed. As a result, of this arrangement, a different airgap value may be transmitted in each transmission window together with a different portion of the second part (temperature). This is advantageous because it enables the ECU 106 (or another receiving entity) to be provided with the most up-to-date value for the first type of information (e.g., air gap information) in each transmission window while the second type of information (e.g., temperature) slowly makes its way to the receiving entity over multiple transmission windows. Notably, in such implementations, the parity bit may be calculated over the second portion only, or in another manner that takes into account that different values for the first portion of the message are transmitted together with different parts of the second portion of the message.

Figure 7B:
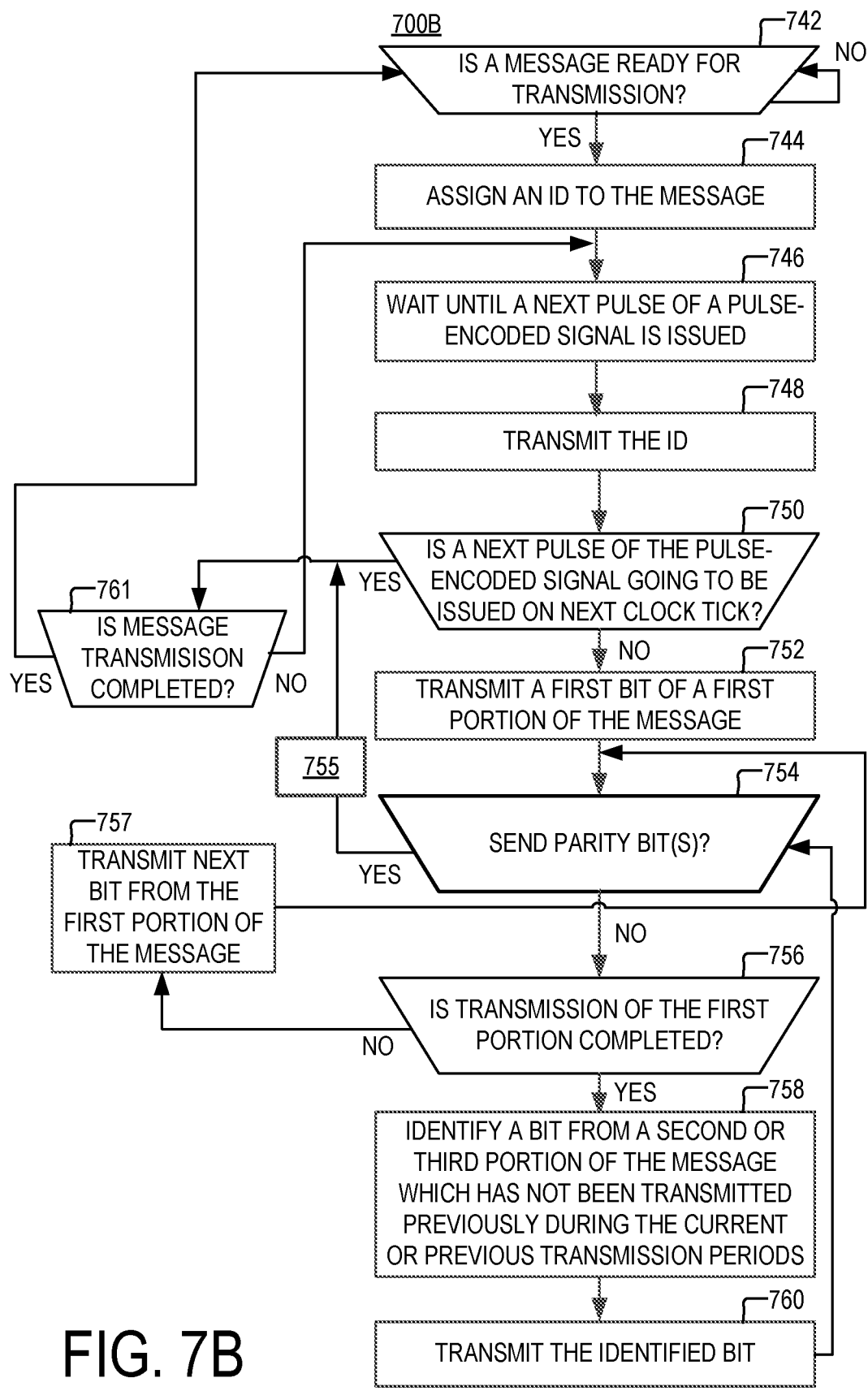
FIG. 7B is a flowchart of an example of a process, according to aspects of the disclosure.

FIG. 7B is a flowchart of an example of process 700B, according to aspects of the disclosure. In this example, process 700B is performed by sensor 104. However, the present disclosure is not limited to any specific entity performing process 700B. As discussed further below, the execution of process 700B results in the transmission of data concurrently with a pulse-encoded signal. The data and pulse-encoded signal may be transmitted from the sensor to a remote device over a data link. In some implementations, the remote device may be the same as or similar to ECU 106, which is discussed above with respect to FIG. 1. In some implementations, the link may be the same as or similar to data link 108.

At step 742, sensor 104 detects that a message is ready for transmission. The message may be the same as or similar to message 300, which is discussed above with respect to FIG. 3. If a message is ready for transmission, the process proceeds to step 744. Otherwise, step 742 is repeated.

At step 744, sensor 104 assigns an ID to the message. In this example, the ID is a 1-bit number. To assign the ID, the sensor ID may first determine the ID of the previous message that was sent by sensor 104. If the ID of the previous message was '0', sensor 104 may assign an ID of '1' to the message detected at step 742. If the ID of the previous message was '1', sensor 104 may assign an ID of '0' to the message detected at step 742.

At step 746, sensor 104 waits until the next pulse of the pulse-encoded signal is issued. The pulse-encoded signal may be the same as or similar to the pulse-encoded signal discussed above with respect to FIG. 2. The next pulse may be the same as or similar to one of the pulses Ts. The next pulse may be transmitted on a given data link, such as link 108, which is discussed above with respect to FIG. 1.

At step 748, the ID is transmitted by sensor 104 to a remote device. In some implementations, the remote device may be the same as or similar to ECU 106, which is discussed above with respect to FIG. 1.

At step 750, sensor 104 determines if the next pulse of the pulse-encoded signal is going to be issued on the next tick (or edge) of the clock that drives the transmission of data and the pulse-encoded signal over the data link. As indicated above, with respect to FIG. 4, the frequency of the clock that drives the transmission of pulses and/or data over the data link may be 15-20 KHz. On the other hand, the operating frequency of the processing circuitry of sensor 104 may be 15-20 MHz, which would give sensor 104 enough time to take action before the next pulse of the pulse-encoded signal is output on link 108. If the next pulse of the pulse-encoded signal is going to be issued on the next clock edge, the process 700B proceeds to step 761. Otherwise, the process 700B proceeds to step 752.

At step 752, sensor 104 transmits the first bit of the first portion of the message. According to the present example, the first portion may be the same as or similar to portion 302 of message 300, which is discussed above with respect to FIG. 3.

At step 754, sensor 104 determines if the transmission of parity bit(s) needs to begin for the current transmission period. If transmission needs to begin, the process 700B proceeds to step 755. Otherwise, the process 700B proceeds to step 756.

The current transmission period begins following the pulse waited for at step 746 and ends at the pulse from the pulse-encoded signal that immediately follows the former pulse (hereinafter referred to as the "next pulse"). Step 754 may include the following sub-steps. First, sensor 104 may identify the last speed measurement that was reported using the pulse-encoded signal. Next, sensor 104 may estimate (or project) the maximum speed that could be reported by the pulse-encoded signal when the next pulse is issued. Next, based on the maximum speed estimate, sensor 104 may determine the earliest time when the next pulse would be issued. Next, based on the earliest time, sensor 104 may determine if there would be enough time to transmit the parity bit(s) that need to be transmitted during the current transmission period, assuming the next transmitted parity bit were from either the first portion or a second portion (or any other remaining portion) of the message (detected at step 742). If there would not be enough time to transmit all necessary parity bits if the next transmitted bit were not a parity bit, sensor 104 may determine that the transmission of the parity bits needs to begin and the process 700B proceeds to step 755. Otherwise, sensor 104 determines that transmission does not need to begin and the process 700B proceeds to step 756.

At step 755, sensor 104 generates and transmits one or more parity bits. The one or more parity bits are generated only for data that is transmitted during the current transmission period.

At step 756, sensor 104 detects if the transmission of the first portion of the message is completed. If the transmission of the first portion of the message is completed, the process 700B proceeds to step 758. Otherwise, the process 700B proceeds to step 757.

At step 757, sensor 104 transmits the next bit of the first portion of the message. The next bit of the first portion of the message is the bit immediately following the last bit of the first portion that was transmitted. After step 757 is completed, the process 700B returns to step 754.

At step 758, sensor 104 identifies a bit from the second portion of the message that has not been transmitted before during the execution of process 700B. The second portion of the message may be the same as or similar to portion 304.

At step 760, sensor 104 transmits the identified bit.

At step 761, sensor 104 detects whether the entire message (detected at step 702) has been transmitted. If the entire message has been transmitted, the process 700B returns to step 742. Otherwise, the process 700B returns to step 746.

As discussed above, process 700B involves the transmission of a message over a plurality of transmission windows. The first portion of the message is transmitted in each of the plurality of transmission windows, while a different part of the second portion may be transmitted in each of the transmitted windows. In other words, in each of the plurality of transmission windows, the first portion is transmitted in its entirety together with a different part of the second portion. In some respects, the first portion may be information that is considered more important, which necessitates the information to be communicated in each transmission window. The second portion, on the other hand, may include information that is considered less important, which permits the information to be transmitted over multiple transmission windows.

In some implementations, the first portion may include airgap information and the second portion may include temperature. The second portion may be calculated (or generated) once, before the transmission of the message (detected at step 742) begins. In other words, the second portion may be calculated (or generated) prior to executing steps 742 or 744.

The first portion on the other hand may be calculated once or multiple times. In the example of FIG. 7B, the first portion may be calculated (or generated) once, before the beginning of the message (detected at step 742) begins. In other words, the first portion may be calculated (or generated) prior to executing steps 742 or 744.

In another example, the first portion may be re-calculated (or regenerated multiple times). For instance, one instance of the first portion may be calculated (or generated) prior to executing steps 742 or 744 and transmitted starting at the first iteration of step 752. Afterwards, prior to each subsequent iteration of step 712, the information that is part of the first portion may be re-calculated or refreshed. As a result, of this arrangement, a different airgap value may be transmitted in each transmission window together with a different portion of the second part (temperature). This is advantageous because it enables the ECU 106 (or another receiving entity) to be provided with the most up-to-date value for the first type of information (e.g., air gap information) in each transmission window while the second type of information (e.g., temperature) slowly makes its way to the receiving entity over multiple transmission windows.

Figure 8:
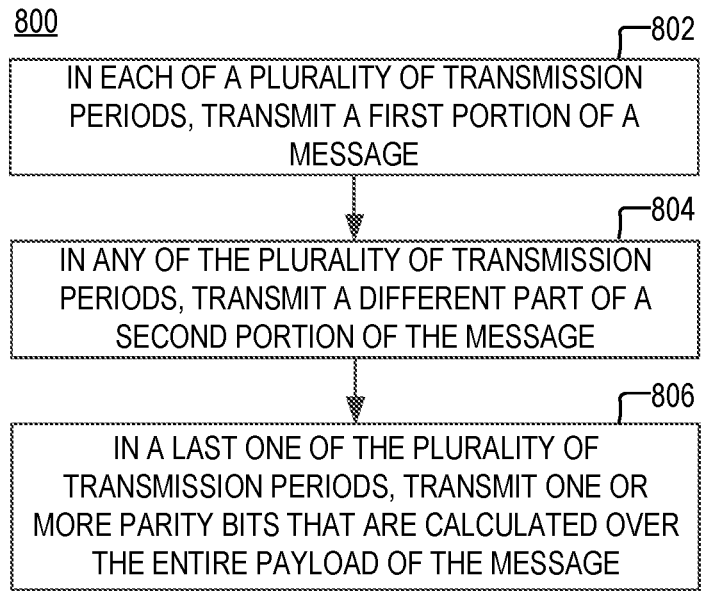
FIG. 8 is a flowchart of an example of a process, according to aspects of the disclosure.

FIG. 8 is a flowchart of an example of process 800 for transmitting a message concurrently with a pulse-encoded signal, according to aspects of the disclosure. In the present example, the pulse-encoded signal is the same as or similar to the pulse-encoded signal discussed above with respect to FIG. 2. The message is also the same as or similar to message 300, which is discussed above with respect to FIG. 3. According to the present example, the message is transmitted in packets formatted as discussed above with respect to FIG. 5. Process 800 is executed by sensor 104 in this example. However, the present disclosure is not limited to any specific entity executing process 800.

At step 802, in each (or at least some) of a plurality of transmission periods, a first portion of the message is transmitted. As noted above, the first portion of the message may be the same as or similar to message portion 302, which is discussed above with respect to FIG. 3. The plurality of transmission periods may be the same as or similar to the transmission periods discussed above with respect to FIG. 2. At step 804, in each (or at least some) of the plurality of transmission periods, a different part of the second portion of the message is transmitted. The second portion of the message may be the same as or similar to portion 304, which is discussed above with respect to FIG. 3. At step 806, in the last one of the plurality of transmission periods, one or more parity bits are transmitted. These parity bits are calculated over the entire contents of the message, including both the first portion and the second portion of the message.

Figure 9:
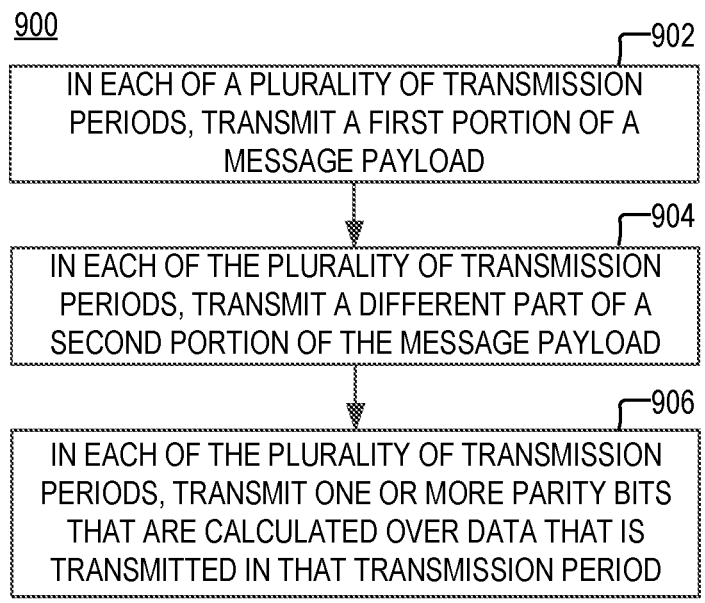
FIG. 9 is a flowchart of an example of a process, according to aspects of the disclosure.

FIG. 9 is a flowchart of an example of process 900 for transmitting a message concurrently with a pulse-encoded signal, according to aspects of the disclosure. In the present example, the pulse-encoded signal is the same as or similar to the pulse-encoded signal discussed above with respect to FIG. 9. The message is also the same as or similar to message 300, which is discussed above with respect to FIG. 3. According to the present example, the message is transmitted in packets formatted as discussed above with respect to FIG. 6. Process 900 is executed by sensor 104 in this example. However, the present disclosure is not limited to any specific entity executing process 900.

At step 902, in each of a plurality of transmission periods, a first portion of the message is transmitted. As noted above, the first portion of the message may be the same as or similar to message portion 302, which is discussed above with respect to FIG. 3. The plurality of transmission periods may be the same as or similar to the transmission periods discussed above with respect to FIG. 2. At step 904, in each (or at least some) of the plurality of transmission periods, a different part of the second portion of the message is transmitted. At step 906, in each (or at least some) of the plurality of transmission periods, one or more parity bits are transmitted. These parity bits are calculated over parts of the message that are transmitted only during that transmission period, including both the first portion and parts of the second portion.

Figure 10:
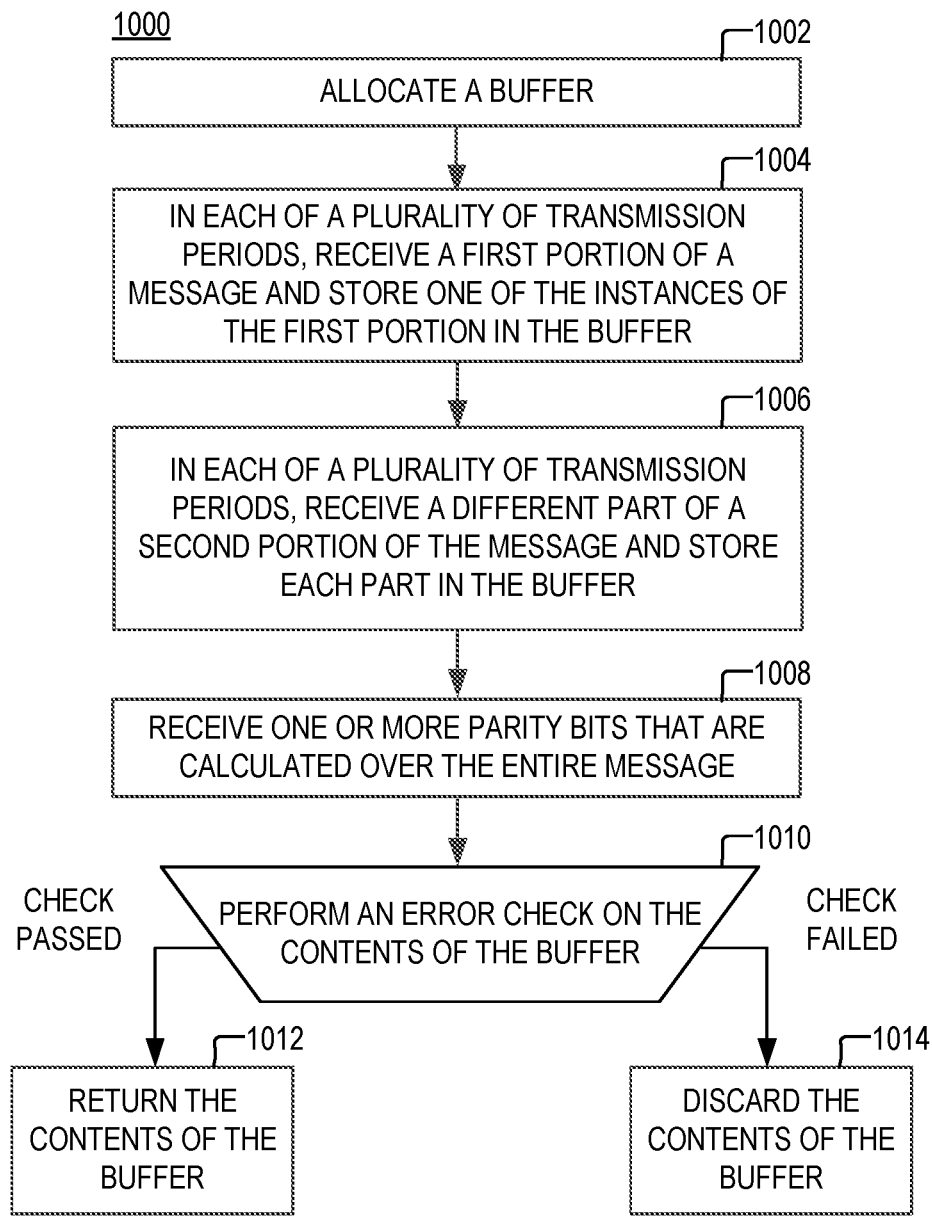
FIG. 10 is a flowchart of an example of a process, according to aspects of the disclosure.

FIG. 10 is a flowchart of an example of process 1000 for receiving the message, according to aspects of the disclosure. In the present example, the message is the same as or similar to message 300, which is discussed above with respect to FIG. 3. The message is transmitted in accordance with one or both of processes 700A and 800, which were discussed above with respect to FIGS. 7A and 8, respectively. Process 1000 is performed by ECU 106 (shown in FIG. 1) in this example. However, the present disclosure is not limited to any specific entity performing process 1000.

At step 1002, a buffer is allocated. At step 1004, in each (or at least some) of a plurality of transmission periods, a first portion of the message is received, and one instance of the first portion of the message is stored in the buffer. At step 1006, in each (or at least some) of the plurality of transmission periods, a different part of the second portion of the message is received and stored in the buffer. At step 1008, one or more parity bits that are calculated over the entire contents of the message are received during the last transmission period in the plurality. At step 1010, an error check is performed on the contents of the buffer based on the received parity bits (received at step 1008). If the error check fails, the process 1000 proceeds to step 1014. Otherwise, if the error check is passed, the process 1000 proceeds to step 1012. At step 1012, the contents of the buffer are returned. At step 1014, the contents of the buffer are discarded.

The example of FIG. 10 assumes that the same value of the first portion of the message is transmitted during each of the plurality of transmission periods that are used to transmit the message and/or the second portion of the message. In instances in which the first portion is updated in each transmission period, each instance of the first portion may be stored in a separate buffer and processed from there, while only the second portion is stored in the buffer allocated at step 1002. Moreover, the parity bits (received at step 1008) may be used to check the integrity of the second portion only.

Figure 11:
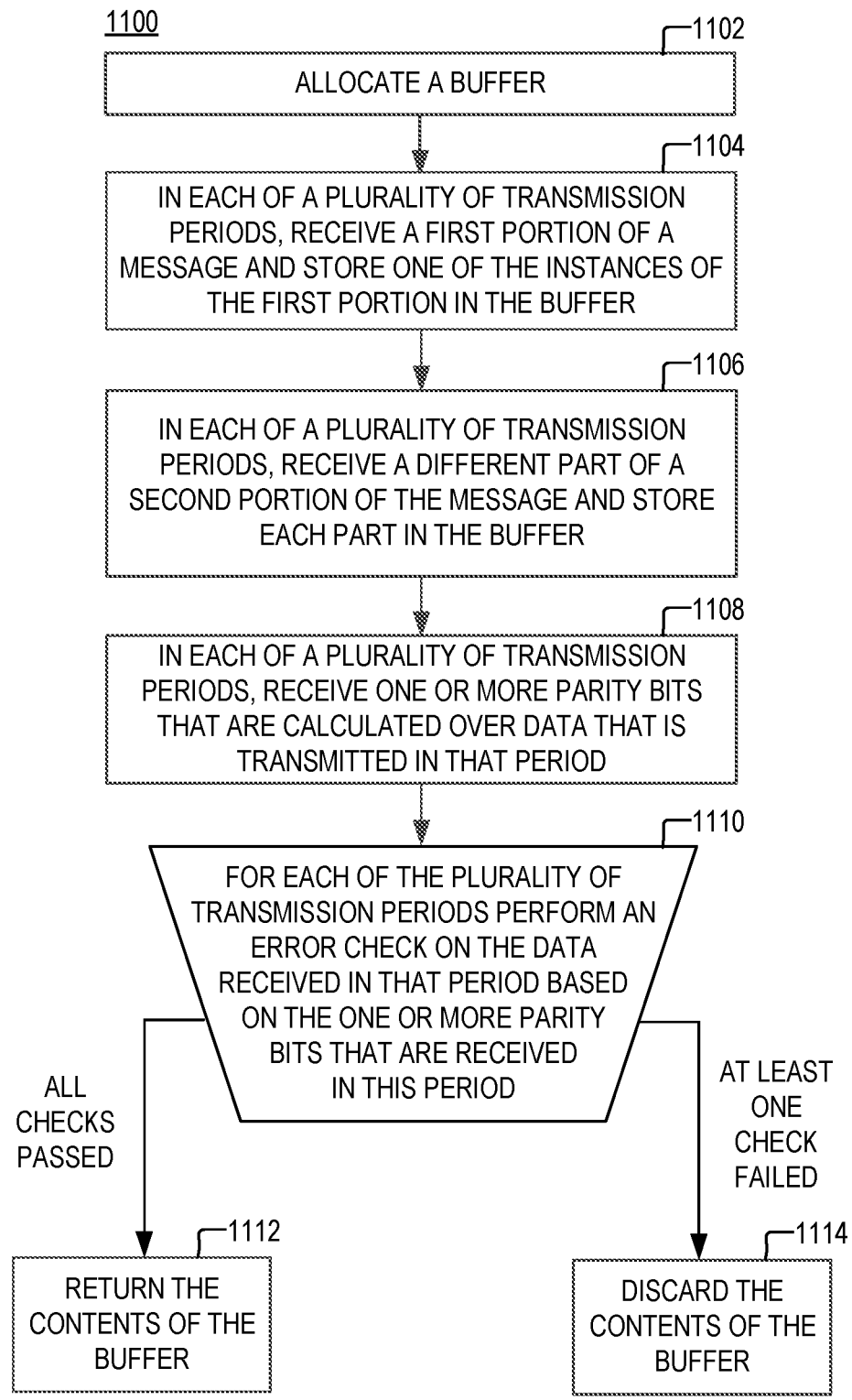
FIG. 11 is a flowchart of an example of a process, according to aspects of the disclosure.

FIG. 11 is a flowchart of an example of process 1100 for receiving the message, according to aspects of the disclosure. In the present example, the message is the same as or similar to message 300, which is discussed above with respect to FIG. 3. The message is transmitted in accordance with one or both of processes 700B and 900, which were discussed above with respect to FIGS. 7B and 9, respectively. Process 1100 is performed by ECU 106 (shown in FIG. 1) in this example. However, the present disclosure is not limited to any specific entity performing process 1100.

At step 1102, a buffer is allocated. At step 1104, in each (or at least some) of the plurality of transmission periods, a first portion of the message is received, and one instance of the first portion of the message is stored in the buffer. At step 1106, in each (or at least some) of the plurality of transmission periods, a different part of the second portion of the message is received and stored in the buffer. At step 1108, one or more parity bits are received during one or more of the last transmission periods. In each of the plurality of transmission periods, the one or more parity bits received during that transmission period belong only to the data received during that transmission period, and they are not usable to check the integrity of data received during other transmission periods. At step 1110, for each of the plurality of transmission periods, an error check is performed on the data received during that transmission period using the one or more parity bits received in the same transmission period. At step 1112, a determination is made if the error check for any of the transmission periods has failed. If the error check for at least one of the transmission periods fails, the process 1100 proceeds to step 1114. Otherwise, if the error checks for all transmission periods pass, the process 1100 proceeds to step 1112. At step 1112, the contents of the buffer are returned. At step 1114, the contents of the buffer are discarded.

The example of FIG. 11 assumes that the same value of the first portion of the message is transmitted during each of the plurality of transmission periods that are used to transmit the message and/or the second portion of the message. In instances in which the first portion is updated in each transmission period, each instance of the first portion may be stored in a separate buffer and processed from there, while only the second portion is stored in the buffer allocated at step 1102. Moreover, the parity bits (received at step 1108) may be used to check the integrity of the second portion only.

Figure 12:
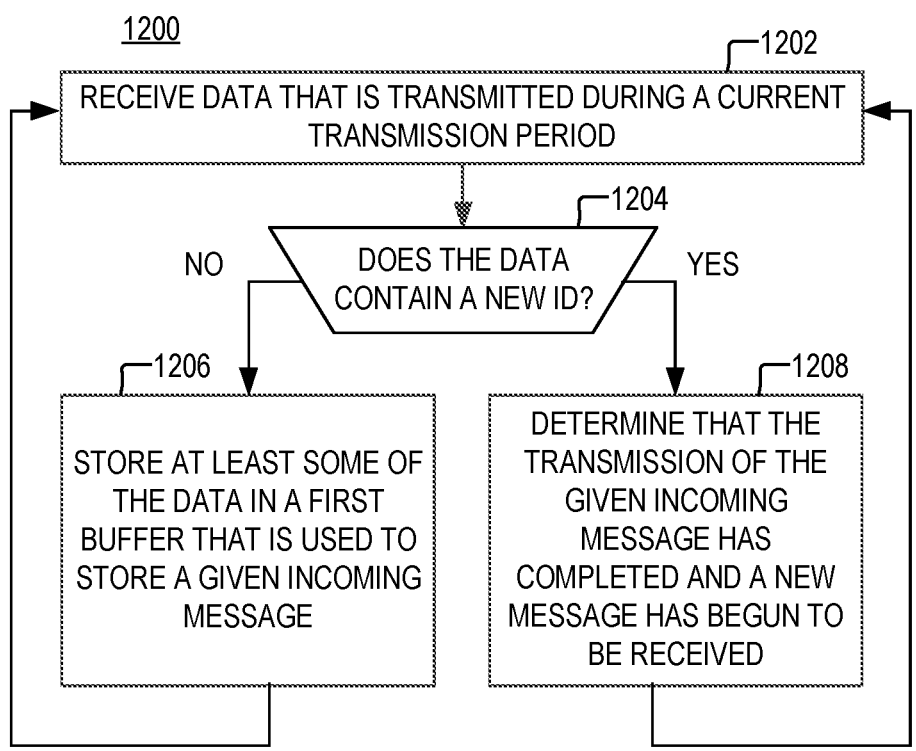
FIG. 12 is a flowchart of an example of a process, according to aspects of the disclosure.

FIG. 12 is a flowchart of an example of process 1200 for receiving a message, according to aspects of the disclosure. In the present example, the message is the same as or similar to message 300, which is discussed above with respect to FIG. 3. The message is transmitted in accordance with one or more of the processes discussed above with respect to FIGS. 7A-B, 8, and 9. Process 1100 is performed by ECU 106 (shown in FIG. 1) in this example. However, the present disclosure is not limited to any specific entity performing process 1100.

At step 1202, data that is received. The transmission period in which the data is received is herein referred to as "the current transmission period." At step 1204, a message ID is extracted from the data, and a determination is made if the message ID is the same as the message ID of the data received during the transmission period immediately preceding the current transmission period (i.e., the previous transmission period). If the message ID is the same (i.e., if the message ID has not changed from the previous transmission period), the process 1200 proceeds to step 1206. If the message ID is different (i.e., if the message ID has changed from the previous transmission period), the process 1200 proceeds to step 1208. At step 1206, at least some of the data is placed in a buffer that is used to store data that is part of a given incoming message. At step 1208, a determination is made that the given incoming message has been transmitted and a new message has begun to be received.

Figure 13:
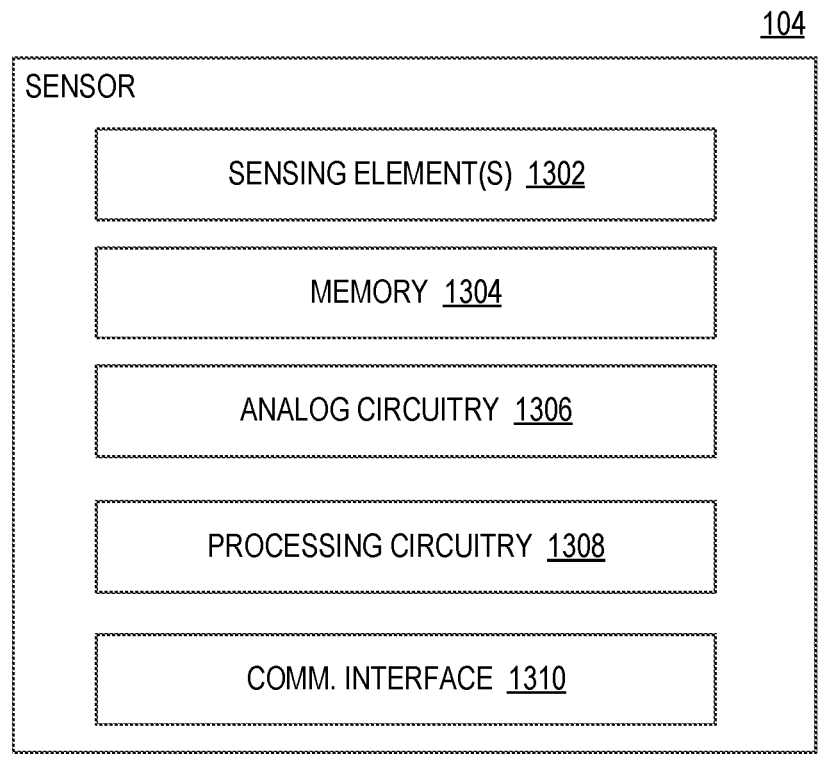
FIG. 13 is a diagram of an example of a sensor, according to aspects of the disclosure.

FIG. 13 is a schematic diagram of the sensor 104, according to aspects of the disclosure. As illustrated, the sensor 104 may include one or more sensing elements 1302, a memory 1304, analog circuitry 1306, processing circuitry 1308, and a communications interface 1310. The one or more sensing elements 1302 may include at least one of a magnetic field sensing element, an optical sensing element, a pressure sensing element, a chemical sensing element, or any other suitable type of sensing element. The memory 1304 may include any suitable type of volatile and/or non-volatile memory, such as flash memory, dynamic random-access memory (DRAM), for example. The analog circuitry 1306 may include one or more amplifiers, analog-to-digital converters, digital-to-analog converters, or any other suitable type of analog circuitry typically found in a sensor. The processing circuitry 1308 may include one or more application-specific processors, general-purpose processors, field-programmable gate arrays (FPGAs), or any other suitable type of processor. The communications interface 1310 may include any suitable type of parallel or serial communications interface. By way of example, in some implementations, the sensor 114 may be a magnetic field sensor, that is designated for use in automotive applications, such as an ABS sensor.

Figure 14:
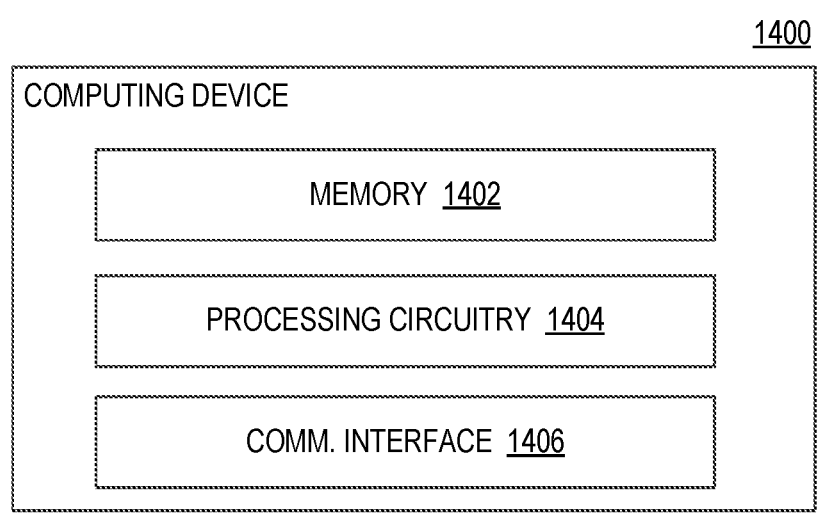
FIG. 14 is a diagram of an example of a sensor, according to aspects of the disclosure.

FIG. 14 is a diagram of an example of a computing device 1400, according to aspects of the disclosure. As illustrated, the computing device 1400 may include a memory 1402, processing circuitry 1404, and a communications interface 1406. The memory 1402 may include any suitable type of volatile or non-volatile memory. For example, the memory 1402 may include a solid-state drive (SSD), a hard disk (HD), a random-access memory (RAM), Synchronous Dynamic Random-Access Memory (SDRAM), etc. The processing circuitry 1404 may include any suitable type of processing circuitry, such as one or more general-purpose processors (e.g., x86 processor, MIPS processor, ARM processor, etc.), special-purpose processors, application-specific integrated circuits (ASICs), field-programmable gate arrays (FPGAs), etc. The communications interface 1406 may include any suitable type of communications interface, such as one or more serial communications interfaces, parallel communications interfaces, Ethernet adapters, wireless data interfaces. The computing device 1400 may be configured to perform any one of the processes discussed with respect to FIGS. 7A, 7B, 8, 9, 10, 11, and 12.

Figure 15:
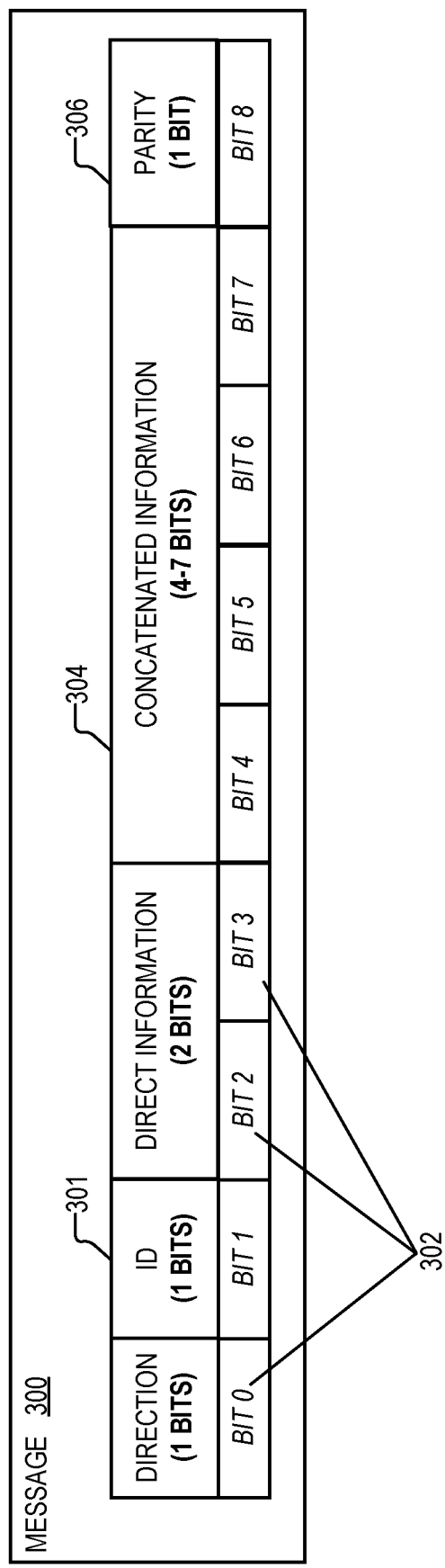
FIG. 15 is a diagram of an example of a message, according to aspects of the disclosure.

FIG. 15 is a diagram of message 300, in accordance with a preferred implementation. In the example of FIG. 15, bit 0 encodes direction information. Bit 1 is the message ID, bits 2-3 are fixed bits (i.e., bits transmitted during each transmission window in which the transmission of the message 300 takes place), bits 4-7 are used to encode concatenated information (i.e., information a different portion of which is transmitted during each transmission window in which the transmission of message 300 takes place), and bit 8 includes parity information. In the example of FIG. 15, portion 302 of message 300 includes bits 0, 2, and 3 and portion 304 of message 300 includes bits 4-7. In this regard, when message 300 is transmitted, in accordance with one of processes 700A-B, bits 0, 2, and 3 may constitute the so-called first message portion, which is transmitted in each one of the transmission windows over which the transmission of message 300 takes place. On the other hand, when message 300 is transmitted, in accordance with one of processes 700A-B, bits 0, 2, and 3 may constitute the so-called second message portion, a different part of which is transmitted in each one of the transmission windows over which the transmission of message 300 takes place. Moreover, in the example of FIGS. 7A-B, the ID is not considered part of the message, but is rather assigned when the transmission of the message begins. However, FIG. 15 illustrates that in some implementations, the ID may be part of the message, in which case steps 704 and 748 may be omitted.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used herein, the term "magnetic-field sensor" is used to describe a circuit that uses a magnetic field sensing element, generally in combination with other circuits. Magnetic-field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic-field density of a magnetic field.

As used herein, the term "magnetic-field sensing element" is used to describe a variety of electronic elements that can sense a magnetic field. The magnetic-field sensing element can be, but is not limited to, a Hall Effect element a magnetoresistance element, a magnetotransistor or an inductive coil. As is known, there are different types of Hall Effect elements, for example, a planar Hall element, a vertical Hall element, and a Circular Vertical Hall (CVH) element.

As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ).

The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A method for transmitting a message concurrently with a pulse-encoded signal, the method comprising:
assigning an identifier to the message;
transmitting an identifier of the message between every two consecutive pulses of the pulse-encoded signal until the whole message is transmitted;
transmitting a first portion of a payload of the message between every two consecutive pulses of the pulse-encoded signal until the whole message is transmitted; and
transmitting a different part of a second portion of the payload of the message between every two consecutive pulses of the pulse-encoded signal until the whole message is transmitted, wherein transmitting each part of the second portion includes: (i) detecting whether a next pulse of the pulse-encoded signal would be issued next time a clock signal changes states, (ii) transmitting a next bit from the payload when the next pulse would not be issued the next time the clock signal changes states, and (iii) abstaining from transmitting the next bit when the next pulse would be issued the next time the clock signal changes states,
wherein the pulse-encoded signal encodes information by varying a frequency of pulses of the pulse-encoded signal, and the message is transmitted over a plurality of transmission periods that are delimited by respective consecutive pulses of the pulse-encoded signal.

2. The method of claim 1, further comprising transmitting one or more parity bits for the payload of the message in a last one of the plurality of transmission periods.

3. The method of claim 1, further comprising transmitting one or more respective parity bits in each of the plurality of transmission periods, the one or more respective parity bits that are transmitted in each of the plurality of transmission periods being calculated only over data that is transmitted during that transmission period.

4. The method of claim 1, wherein the identifier of the message is 1-bit wide, and assigning the identifier to the message includes:
setting the identifier of the message to '1' if an identifier of a previous message was set to '0'; and
setting an identifier of the message to '0' if an identifier of the previous message was set to '1'.

5. The method of claim 1, wherein the pulse-encoded signal encodes a speed of rotation of a target, the first portion of the message encodes a direction of the rotation of the target, and the second portion of the message encodes one or more of temperature information, airgap information, and/or diagnostic information.

6. The method of claim 1, wherein the first portion of the message is transmitted repeatedly during each of the plurality of transmission periods and the second portion of the message is transmitted only once, the second portion of the message being transmitted over the plurality of transmission periods.

7. The method of claim 1, wherein the transmission periods in the plurality of transmission periods have a variable length.

8. The method of claim 1, wherein the first portion is recalculated before each transmission of the first portion.

9. A system, comprising:
a memory; and
a processing circuitry that is operatively coupled to the memory, the processing circuitry being configured to:
assign an identifier to a message;
transmit an identifier of the message between every two consecutive pulses of a pulse-encoded signal until the whole message is transmitted;
transmit a first portion of a payload of the message between every two consecutive pulses of the pulse-encoded signal until the whole message is transmitted; and
transmit a different part of a second portion of the payload of the message between every two consecutive pulses of the pulse-encoded signal until the whole message is transmitted, wherein transmitting each part of the second portion includes: (i) detecting whether a next pulse of the pulse-encoded signal would be issued next time a clock signal changes states, (ii) transmitting a next bit from the payload when the next pulse would not be issued the next time the clock signal changes states, and (iii) abstaining from transmitting the next bit when the next pulse would be issued the next time the clock signal changes states,
wherein the pulse-encoded signal encodes information by varying a frequency of pulses of the pulse-encoded signal, and the message is transmitted over a plurality of transmission periods that are delimited by respective consecutive pulses of the pulse-encoded signal.

10. The system of claim 9, wherein the processing circuitry is further configured to transmit one or more parity bits for the payload of the message in a last one of the plurality of transmission periods.

11. The system of claim 9, wherein the processing circuitry is further configured to transmit one or more respective parity bits in each of the plurality of transmission periods, the one or more respective parity bits that are transmitted in each of the plurality of transmission periods being calculated only over data that is transmitted during that transmission period.

12. The system of claim 9, wherein the identifier of the message is 1-bit wide, and assigning the identifier to the message includes:
setting the identifier of the message to '1' if an identifier of a previous message was set to '0'; and
setting an identifier of the message to '0' if an identifier of the previous message was set to '1'.

13. The system of claim 9, wherein the pulse-encoded signal encodes a speed of rotation of a target, the first portion of the message encodes a direction of the rotation of the target, and the second portion of the message encodes one or more of temperature information, airgap information, and/or diagnostic information.

14. The system of claim 9, wherein the first portion of the message is transmitted repeatedly during each of the plurality of transmission periods and the second portion of the message is transmitted only once, the second portion of the message being transmitted over the plurality of transmission periods.

15. The system of claim 9, wherein the transmission periods in the plurality of transmission periods have a variable length.

16. The system of claim 9, wherein the first portion is recalculated before each transmission of the first portion.

17. A non-transitory computer-readable medium storing one or more processor-executable instructions, which, when executed by at least one processor, cause the at least one processor to execute a process for transmitting a message concurrently with a pulse-encoded signal, the process including the operations of:

assigning an identifier to the message;

transmitting an identifier of the message between every two consecutive pulses of the pulse-encoded signal until the whole message is transmitted;

transmitting a first portion of a payload of the message between every two consecutive pulses of the pulse-encoded signal until the whole message is transmitted; and transmitting a different part of a second portion of the payload of the message between every two consecutive pulses of the pulse-encoded signal until the whole message is transmitted, wherein transmitting each part of the second portion includes: (i) detecting whether a next pulse of the pulse-encoded signal would be issued next time a clock signal changes states, (ii) transmitting a next bit from the payload when the next pulse would not be issued the next time the clock signal changes states, and (iii) abstaining from transmitting the next bit when the next pulse would be issued the next time the clock signal changes states, wherein the pulse-encoded signal encodes information by varying a frequency of pulses of the pulse-encoded signal, and the message is transmitted over a plurality of transmission periods that are delimited by respective consecutive pulses of the pulse-encoded signal.

\* \* \* \* \*